(12) United States Patent
Rosenberg et al.

(10) Patent No.: US 9,297,967 B2
(45) Date of Patent: Mar. 29, 2016

(54) DEVICE FOR CONVERTING SIGNAL

(75) Inventors: Paul Kessler Rosenberg, Sunnyvale, CA (US); Sagi Varghese Mathai, Palo Alto, CA (US); Michael Renne Ty Tan, Menlo Park, CA (US); Joseph Straznicky, Santa Rosa, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 262 days.

(21) Appl. No.: 13/640,392

(22) PCT Filed: Apr. 30, 2010

(86) PCT No.: PCT/US2010/033310
§ 371 (c)(1),
(2), (4) Date: Oct. 10, 2012

(87) PCT Pub. No.: WO2011/136818
PCT Pub. Date: Nov. 3, 2011

(65) Prior Publication Data
US 2013/0071064 A1    Mar. 21, 2013

(51) Int. Cl.
G02B 6/30  (2006.01)
G02B 6/42  (2006.01)
H04N 5/225  (2006.01)
H05K 3/30  (2006.01)

(52) U.S. Cl.
CPC ............... G02B 6/42 (2013.01); G02B 6/4292 (2013.01); H04N 5/225 (2013.01); H04N 5/2251 (2013.01); H05K 3/30 (2013.01); Y10T 29/4913 (2015.01)

(58) Field of Classification Search
None
See application file for complete search history.

(56) References Cited

U.S. PATENT DOCUMENTS

| | | | |
|---|---|---|---|
| 5,574,814 A | | 11/1996 | Noddings et al. |
| 5,933,558 A | * | 8/1999 | Sauvageau et al. ............ 385/88 |
| 5,940,562 A | * | 8/1999 | Henson et al. .................. 385/88 |
| 6,197,482 B1 | * | 3/2001 | Lobo et al. ..................... 430/350 |
| 6,374,004 B1 | * | 4/2002 | Han et al. ........................ 385/14 |
| 6,821,027 B2 | * | 11/2004 | Lee et al. ......................... 385/89 |
| 6,821,028 B2 | * | 11/2004 | Morris et al. ................... 385/92 |
| 6,863,444 B2 | * | 3/2005 | Anderson et al. ............... 385/53 |
| 7,002,257 B2 | | 2/2006 | Tao et al. |
| 7,316,509 B2 | | 1/2008 | Posamentier |
| 7,401,985 B2 | | 7/2008 | Aronson et al. |
| 7,449,674 B2 | | 11/2008 | Ueno et al. |
| 8,109,675 B1 | * | 2/2012 | Zhovnirovsky et al. ........ 385/74 |

(Continued)

FOREIGN PATENT DOCUMENTS

| | | |
|---|---|---|
| JP | 2005317658 | 11/2005 |
| JP | 2007093731 | 4/2007 |

(Continued)

OTHER PUBLICATIONS

PCT Search Report, Dec. 29, 2010, HPDC, PCT Application No. PCT/US2010/033310, Filed Apr. 30, 2010.

*Primary Examiner* — Tina Wong
(74) *Attorney, Agent, or Firm* — Thorpe North & Western

(57) ABSTRACT

A device for converting and optionally processing an optical signal comprises an optical cable having an optical-electrical conversion device at one end, the optical-electrical conversion device to convert the optical signal to an electrical signal or an electrical signal into an optical signal; a electrical package to removably receive the optical-electrical conversion device and generate processed signal; and a general circuit board attached to the electrical package and operable to receive the processed signal.

19 Claims, 4 Drawing Sheets

(56) References Cited

U.S. PATENT DOCUMENTS

| | | | |
|---|---|---|---|
| 8,195,017 B2* | 6/2012 | Kaneshiro et al. | 385/49 |
| 8,641,299 B2* | 2/2014 | Daikuhara et al. | 385/93 |
| 2006/0067631 A1* | 3/2006 | Wang et al. | 385/92 |
| 2007/0140627 A1 | 6/2007 | Lu | |
| 2010/0008630 A1* | 1/2010 | Marrapode et al. | 385/78 |
| 2010/0098383 A1 | 4/2010 | Koreeda et al. | |
| 2011/0164851 A1* | 7/2011 | Ishigami | 385/93 |
| 2012/0045187 A1* | 2/2012 | Khadar | 385/136 |

FOREIGN PATENT DOCUMENTS

| | | |
|---|---|---|
| KR | 10-20070111303 | 11/2007 |
| TW | 220388 A | 2/1994 |
| TW | 200942885 | 10/2009 |

* cited by examiner

DEVICE FOR CONVERTING SIGNAL

BACKGROUND

Generally, optical packages have an optical interface, where an optical cable is attached to receive or transmit an optical signal. Optical packaging generally co-locates integrated circuits and active optical components. Therefore, a package is typically designed to be used with an electrical socket, since delicate optical components cannot withstand exposure to Printed Circuit Board (PCB) solder reflow temperatures.

Optical packages can include optical cables having optical fibers. Optical fibers are widely used in fiber-optic communications, which permits transmission over longer distances and at higher bandwidths (data rates) than other forms of communications. Fibers are used instead of metal wires because signals travel along them with less loss, and they are also resistant to electromagnetic interference. Fibers are also used for illumination, and are wrapped in bundles so they can be used to carry images, thus allowing viewing in tight spaces. Specially designed fibers are used for a variety of other applications, including sensors and fiber lasers.

BRIEF DESCRIPTION OF THE DRAWINGS

Additional features and advantages of the disclosure will be apparent from the detailed description which follows, taken in conjunction with the accompanying drawings, which together illustrate, by way of example, features of the disclosure; and, wherein.

DETAILED DESCRIPTION

Figure 1:
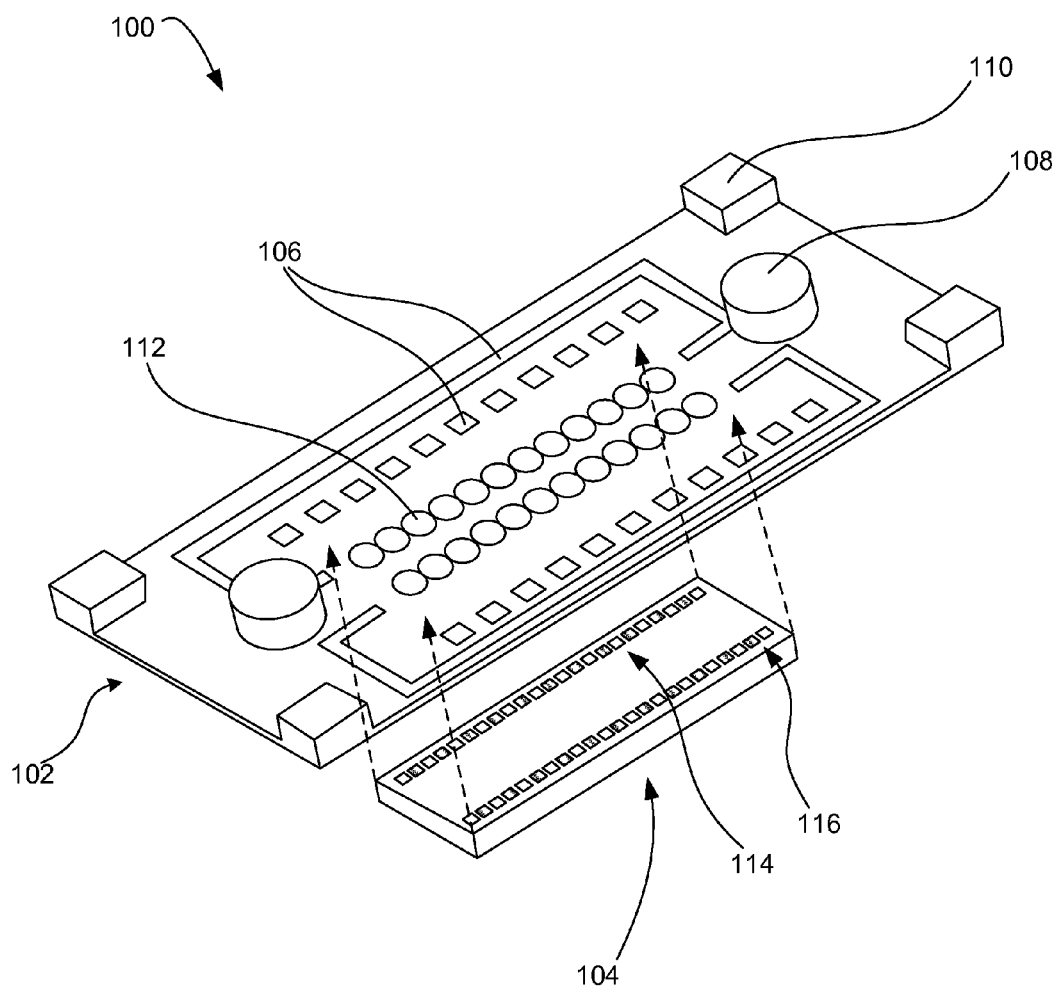
FIG. 1 is a perspective view of an optical-electrical conversion device in accordance with an example of the present disclosure.

Before the present disclosure is described, it is to be understood that this disclosure is not limited to the particular process steps and materials disclosed herein because such process steps and materials may vary somewhat. It is also to be understood that the terminology used herein is used for the purpose of describing particular examples only. The terms are not intended to be limiting because the scope of the present disclosure is intended to be limited only by the appended claims and equivalents thereof.

It must be noted that, as used in this specification and the appended claims, the singular forms "a," "an," and "the" include plural referents unless the context clearly dictates otherwise.

As used herein, "optical-electrical conversion device" refers to an optical interface attached to an active optical element. Generally, the active optical element receives and converts an optical signal into an electric signal.

As used herein, "optical cable" refers to a cable having optical fibers or optical wave guides that transmits an optical signal on to an active optical element through an optical interface.

As used herein, "optics" or "optical components" generally refer to the optical interface and the active optical element(s).

As used herein, "electrical package" refers to a substrate having at least one integrated circuit, or other processor, and an open area for receiving an optical-electrical conversion device. Generally, the electrical package is attached to or is otherwise in electrical contact with, or in communication with, the general circuit board. Additionally, the electrical package generally processes an electrical signal from an optical cable.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

It has been recognized that it would be advantageous to develop optical devices suitable for a wide variety of applications. In accordance with this, devices and methods described herein can include an optical device that encloses an optical-electrical conversion device at one end of an optical cable for attachment to an electrical package on a circuit board. As such, the present disclosure provides optical devices allowing for varying optical packages on circuit boards via a removable cable containing the active optical elements rather than having such elements enclosed or embedded on the circuit board and/or electrical package.

As such, a device for converting (e.g., optical signal to electrical signal, or vice versa), and processing such signal, can comprise an optical cable having an optical-electrical conversion device at one end, the optical-electrical conversion device to convert an optical signal to an electrical signal or to convert an electrical signal to an optical signal; a electrical package to removably receive the optical-electrical conversion device and generate processed signal; and a circuit board attached to the electrical package and operable to receive the processed signal.

In another embodiment, a device for converting signal (e.g., optical signal to electrical signal, or vice versa) can comprise an optical cable including an optical waveguide, and an optical-electrical conversion device attached at one end of the optical cable. The optical-electrical conversion device can be configured for converting optical signal to electrical signal or for converting electrical signal to optical signal. More specifically, the optical-electrical conversion device can include an active optical element, an optical interface positioned between the optical waveguide and the active optical element, and an alignment structure. The optical interface allows optical communication between the optical waveguide and the active optical element. Also, the alignment structure is positioned for optically aligning the optical waveguide of the optical cable with the active optical element.

It is noted that when describing an optical device or a method of manufacturing or using such a device, each of these descriptions can be considered applicable to each of these examples, whether or not they are explicitly discussed in the context of that example. For example, in discussing active optical elements for the optical device, those active optical elements can also be used in a method for manufacturing such a device, and vice versa.

Various modifications and combinations that can be derived from the present disclosure and illustrations, and as such, the following figures should not be considered limiting.

Turning now to FIG. 1, an optical-electrical conversion device 100 can comprise an optical interface 102 attached to an active optical element 104. Attachment of the active optical element to the optical interface can be by any method known in the art. For example, the optical interface can be metalized to allow attachment of the active optical element by flip chip attachment. Additionally, other known methods of attachment include, without limitation, adhesive followed by wire bonding, direct chip attachment, bonders, polymer adhesives, epoxy bonding, soldering, etc. In one example, an "underfill," which is a thin adhesive layer that is applied between a flip chip die and the substrate it is attached to, can be used as a coating adhesive to improve the robustness of the chip attachment. Generally, the adhesive 'fills under' the gap between the two attached elements and strengthens the attachment. Notably, in one example, the underfill can be optically transparent at wavelengths of interest allowing light to pass through it. Additionally, a "glob top" can be used as a coating adhesive to improve the robustness of the chip attachment. Generally, a glob top is an adhesive coating typically applied over exposed wire bonded integrated circuits (ICs) to protect the delicate wires and chips. Glob top can be typically used when ICs are attached directly to large printed circuit boards (PCBs) (process known as 'Chip On Board' (COB), rather than the IC packaged separately in a plastic or ceramic package.

The optical interface 102 generally includes electrical attachment pads and traces 106 and alignment structures 108. Additionally, the optical interface can include standoffs 110 and/or a lens(es) 112. Generally, lenses can be positioned over photodetectors 114 or lasers 116 to focus the transmitted optical signals, respectively, into or out of an optical waveguide, e.g., a plurality of optical fibers. Generally, the lens(es) may or may not be present in the optical interface. In one example, where a laser transmits into a multimode fiber, the lenses may be absent. In another example where a photodiode has a small active area, e.g., 50 μm diameter for example, a lens may be used. As discussed herein, the optical-electrical conversion device can comprise lasers that emit an optical signal. As such, the optical cables described herein can allow for optical communication between a processor and a secondary device.

Figure 2A:
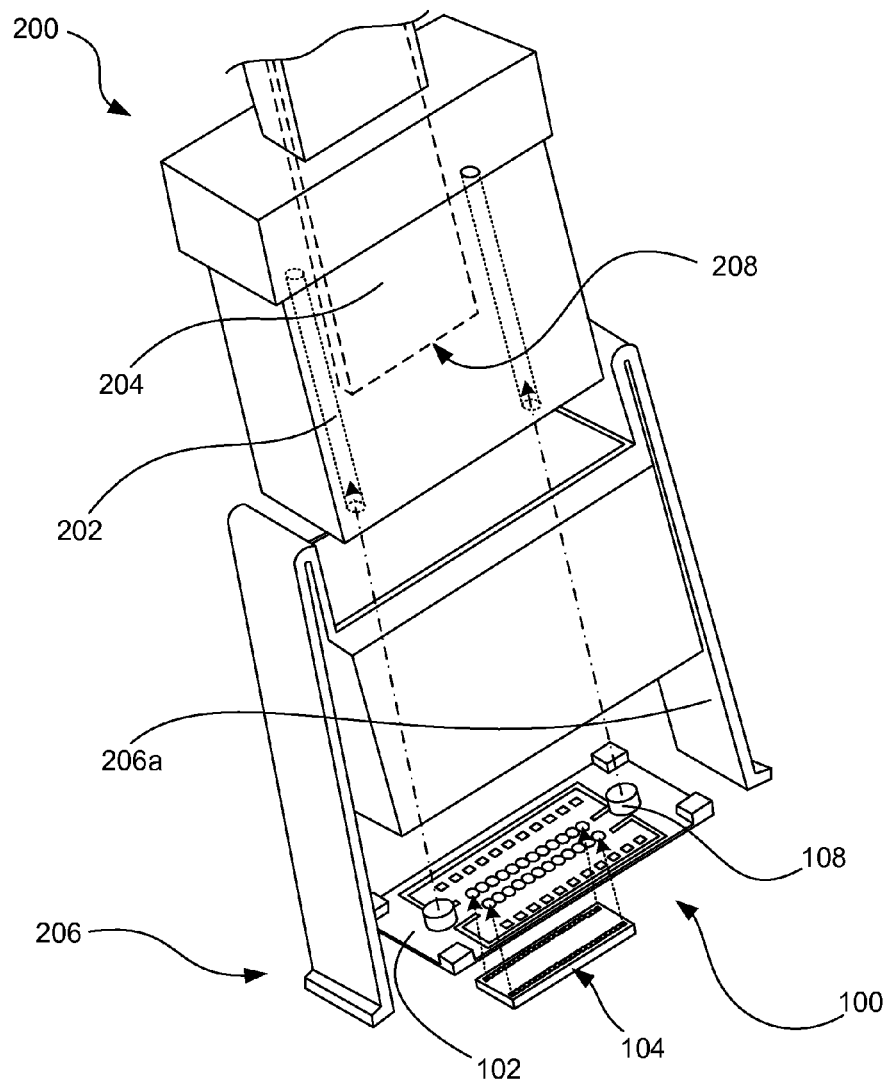
FIG. 2a is a perspective view of an optical cable in accordance with an example of the present disclosure.

Continuing with FIG. 1, and with some reference to FIG. 2a, the alignment structure 108 can be used to position the optical-electrical conversion device with respect to the optical cable 200. In one example, the positioning can be a somewhat to very precise alignment. Additionally, the optical interface metallization features, e.g., electrical traces, can determine the position of the optical active elements by being located with respect to alignment structures on the top side of the optical interface. The alignment structure can be mated with alignment holes 202 providing for positioning of the active optical element with respect to the optical fibers 208 within the optical waveguide 204 (shown in FIG. 2a and discussed in further detail below). As mentioned, in one example, the positioning can be a precise alignment. The present examples can provide optical alignment precision for both 1) multimode alignment, with a radial positioning accuracy of less than 5 microns and/or 2) single mode alignment with a radial positioning accuracy of less than 1 micron.

The optical interface 102 can be manufactured from any materials that are generally used for optical interface manufacture, including without limitation, glass, sapphire, silicone, plastics, high temperature plastic, ceramics, etc. In one example, the material can be glass and/or sapphire. In another example, the optical interface can be a transparent substrate. As mentioned, the active optical element 104 can comprise photodetectors 114 or lasers 116. In one example, the active optical element can contain an array of photodetectors. In another example, the active optical element can contain an array of lasers. In another example, the photodetectors can be selected from the group consisting of optical detectors, chemical detectors, photoresistors, photovoltaic cells, photodiodes, phototransistors, light emitting diodes, and combinations thereof. The lasers can be selected from the group of vertical cavity surface emitting lasers, fabry-perot lasers, distributed feedback lasers, etc.

Figure 2B:
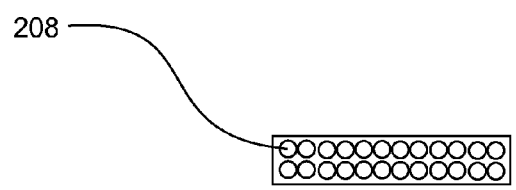
FIG. 2b is an end view of an optical wave guide in accordance with an example of the present disclosure.

Turning now to FIGS. 2a and 2b, an optical cable 200 can comprise channels 202 for receiving the alignment structures 108 from the optical-electrical conversion device 100. Additionally, the optical cable can comprise an optical waveguide 204, which generally includes optical fibers 208 (shown as an end view in FIG. 2b). As previously described, the active optical elements 104 can be more precisely aligned with the optical fibers in the optical waveguide by more precise attachment of the active optical elements to the optical interface 102 via flip chip attachment, or other means, and further use of the alignment structures to mate with the channels of the optical cable. In one example, the optical cable can comprise a fastening feature 206, such as a clip, fitting, or the like.

The devices described herein can provide precise alignment of optical components with cables and to other devices. In one example, the active optical element 104 can be attached to an optical cable 200, as described herein, so that the active components of active optical element, which can include lasers 116, photodetectors 114, etc., can either transmit light into the optic waveguide or receive light from the optic waveguide. In another example, the optical cable can contain an optical waveguide 204 having a plurality of optical fibers 208 that are positioned with respect to channels 202 on the face of the cable connector. As such, when the active optical element is attached to the optical cable, the alignment structures of can be positioned into the channels. Thus, the active components, e.g., laser or photodetectors, can be precisely positioned with respect to the optical fibers.

It is noted that while the present figures have shown certain features of the present disclosure, such features are merely exemplary and do not limit the disclosure as set forth herein. For example, while FIG. 2 shows a clip 206a as a fastening feature 206, such disclosure is not limiting as the present disclosure contemplates the use of any type of fastening feature, e.g., fittings, screws, etc. Additionally, while the fastening feature is depicted as a separate component from the optical cable; i.e., it is removable from the optical cable housing, the present disclosure contemplates the use of a single molded assembly; i.e., where the fastening feature is single molded with the optical cable housing.

The optical cables described herein can have the active optical elements incorporated therein allowing for removal of the optical components from the electrical package. Such removability provides benefits not found with traditional optical components that are attached to an electrical package, or processor, during fabrication. Generally traditional optical components are permanently attached to a processor. The present optical cable allows for increased optical functionality as the optics can be switched out by removing of the optical cable rather than removal of the optical cable and the processor, and lower costs as the optics can be manufactured separately from the processor and can be attached subsequent to the processor manufacturing. Additionally, the optics described herein can be located at the end of the optical cable rather than buried inside the optical cable allowing for heat dissipation.

Figure 3:
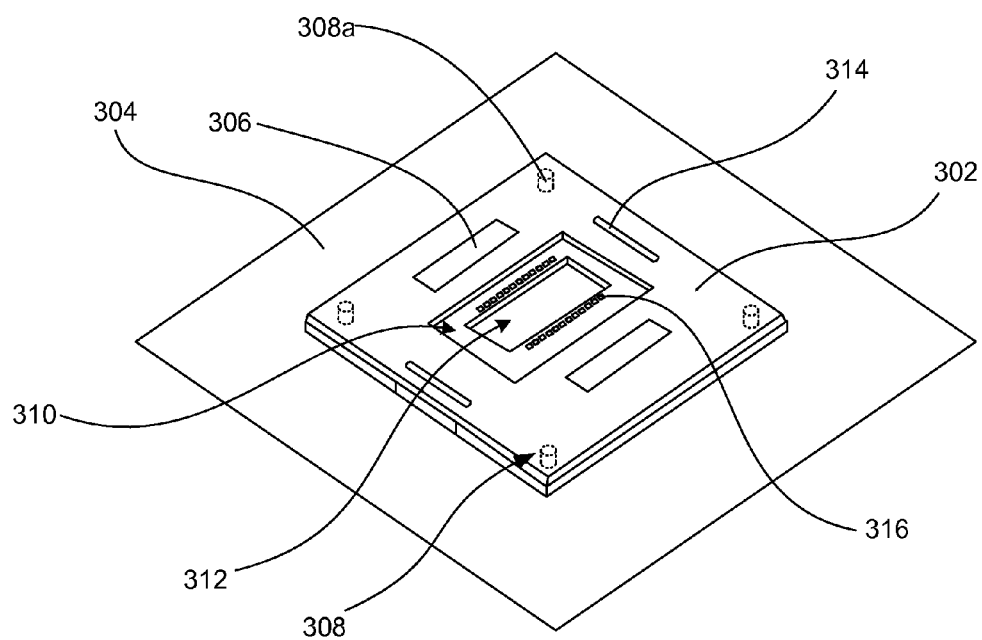
FIG. 3 is a perspective view of an electrical package attached to a general circuit board in accordance with an example of the present disclosure.

Turning now to FIG. 3 (and referring back to FIGS. 1 and 2), an electrical package 302 attached to a general circuit board 304 (a portion of which is shown). The electrical package can comprise integrated circuits 306. The electrical package can also comprise attachment features 308 for attachment of the electrical package to the general circuit board. In one example, the attachment features can be solder posts 308a. Additionally, the attachment features can be snap in clips, screws, or other metal posts. The electrical package 302 can also contain elements such as solder spheres, electrical pins, etc. for making electrical contact to the electrical circuit board 304. The solder posts can be any shape. In one example, the solder posts can be solder spheres. The electrical package can be a modified plastic ball grid array. Electrical connection between 302 and the system PCB can be made removably by means of a socket as well as by permanent attachment with solder. The electrical package can also include an open area 310 for receiving the optical-electrical conversion device 100 at the end of the optic cable 200. Additionally, a recessed area 312 can be fabricated into the electrical package by molding, milling or other means to receive the active optical element 104 attached to the optical interface 102 of the optical-electrical conversion device 100. This recessed area can provide clearance for the active optical element when the optical cable is mated to the electrical package.

As previously discussed, the optical cable 200 can comprise a fastening feature 206 for an additional point of attachment of the optical cable to the electrical package 302. The electrical package can have slots 314 operable to receive the fastening feature. As previously discussed, the optical interface can be attached to the active optical element and comprises electrical attachment pads and traces 106 in electric communication with the active optical element. Additionally, the electrical traces can mate with corresponding electrical contacts 316 on the electrical package. In one example, the electrical package can comprise at least one integrated circuit and electrical contacts that mate with electrical traces from the optical cable. Additionally, the electrical contacts can be in electrical communication to the portions of the integrated circuits that can either drive the lasers or receive and amplify signals from the photodetectors. Further, the electrical contacts can supply power and grounding to the optical cable.

Figure 4:
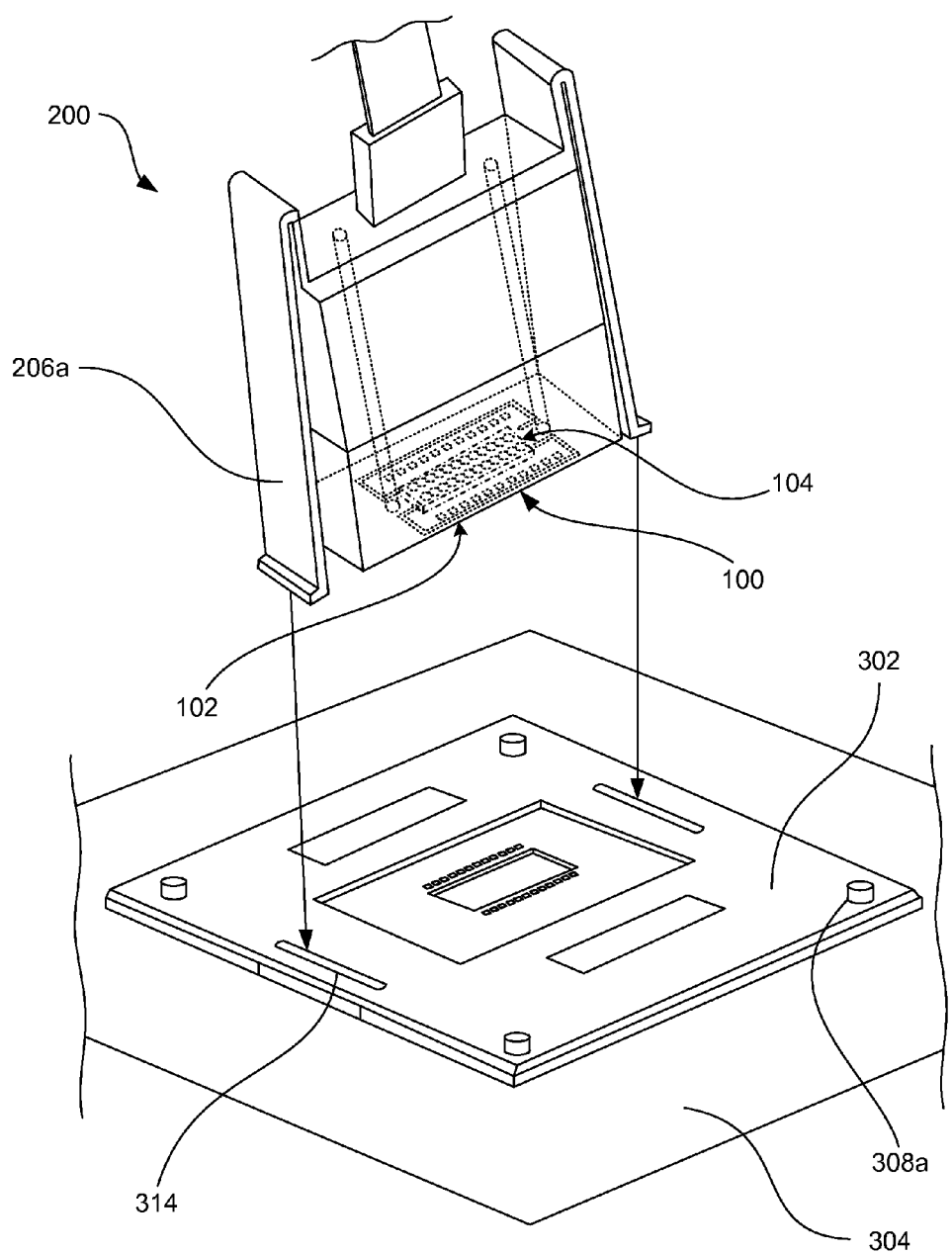
FIG. 4 is perspective view of a device for converting and processing an optical signal in accordance with an example of the present disclosure.

Turning now to FIG. 4, a schematic showing the various parts previously described as they are assembled together is shown. Thus, both the device and method for manufacturing the device is illustrated by example therein. Specifically, the method of manufacture can comprise attaching an electrical package 302 to a general circuit board 304. Additional steps include connecting an optical cable 200 to the electrical package by mating the optical-electrical conversion device 100 at one end of the optical cable to the electrical package. The optical-electrical conversion device can convert an optical signal into an electrical signal. In another example, the optical-electrical conversion device can convert an electrical signal into an optical signal. The method can further comprise aligning optical fibers from an optical waveguide to an optical active element of an optical-electrical conversion device via alignment structures. Additionally, the method can include attaching the electrical package to the general circuit board by soldering the electrical package to the general circuit board using a plurality of soldering posts and/or balls.

It is understood that the optical cable 200 may transfer a mechanical load to the electrical package 302. As such, the present disclosure provides solder posts 308a, attachment features 308, or other mechanical stress relief to the device. The solder posts can be soldered into the general circuit board during a standard reflow process. Other techniques may be employed to protect the electrical contacts and electrical package 302 in general from mechanical loading through the optical cable, such as the use of plastic or sheet metal clips that snap onto the general circuit board and/or electrical package. The optical cable may also be designed to release from the electrical package if the physical load exceeds a set value. In one example, magnetic attachment can perform this function.

In another example, a method of manufacturing the device described herein can comprise attaching the electrical package to the general circuit board and connecting the optical cable to the electrical package by mating the optical-electrical conversion device at one end of the optical cable to the electrical package. Further, the optical-electrical conversion device can convert an optical signal into an electrical signal or an electrical signal into an optical signal.

In another example, a method for converting optical signal to electrical signal and processing the electrical signal accordingly is provided. The method includes generating an optical signal and converting the optical signal to an electrical signal within an optical cable. The optical cable can have an optical-electrical conversion device at one end, and is operable to convert optical signal to electrical signal and to convert electrical signal to optical signal. Additional steps include transferring the electrical signal from the optical cable to an electrical package, generating a processed signal at the electrical package, and transferring the processed signal from the electrical package to a general circuit board attached to the electrical package. In one particular example, the method can comprise the preliminary step of removably attaching the optical cable to the electrical package, as described herein. The method can further comprise converting electrical signal to optical signal for bi-directional communication.

In summary, the present disclosure provides a removable optical cable having the active optical components attached thereto such that the optic can be easily removed from the general circuit board. It is noted that these methods and devices can be modified independently of each other. Additionally, it is notable that the general circuit board and/or electrical package can be manufactured via standard solder reflow processes as the optics are contained wholly within the optical cable, which can be subsequently attached the general circuit board and/or electrical package. Further, the present devices and methods can provide for increased functionality as the optics can be easily replaced by removal of the optical cable while reusing the electrical package.

While the disclosure has been described with reference to certain examples, those skilled in the art will appreciate that various modifications, changes, omissions, and substitutions can be made without departing from the spirit of the disclosure. It is intended, therefore, that the disclosure be limited only by the scope of the following claims.

What is claimed is:

1. A device for converting signal, comprising:
   an optical cable having an optical-electrical conversion device comprising an active optical element attached to an optical interface at one end, the optical-electrical conversion device for converting optical signals from the optical cable to electrical signals or for converting electrical signals to optical signals to the optical cable;
   an electrical package to:
     receive the optical cable having the optical-electrical conversion device in a manner that the optical cable having the optical-electrical conversion device is removable from the electrical package;
     receive an electrical signal from the optical cable;

generate processed signals from the electrical signal; and a general circuit board attached to the electrical package for receiving the processed signal, wherein the optical interface comprises:
electrical contacts to provide electrical communication between the electrical package and the optical-electrical conversion device; and
at least one lens to provide optical communication between active optical element and the optical cable.

2. The device of claim 1, wherein the active optical element comprises photo detectors or lasers.

3. The device of claim 2, wherein the active optical element includes photodetectors, and the photo detectors are selected from the group consisting of optical detectors, chemical detectors, photoresistors, photovoltaic cells, photodiodes, phototransistors, light emitting diodes, and combinations thereof.

4. The device of claim 1, wherein the optical-electrical conversion device includes at least one alignment structure for aligning one or more optical waveguide from an optical cable to an active optical element of the optical-electrical conversion device, the at least one alignment structure protrudes from the optical-electrical conversion device.

5. The device of claim 1, wherein the optical interface is attached to the active optical element and comprises electrical attachment pads and traces in electric communication with the active optical element, the electrical attachment pads and traces operable to mate with corresponding electrical contacts on the electrical package.

6. The device of claim 1, wherein the optical cable comprises a fastening feature for an additional point of attachment of the optical cable to the electrical package.

7. The device of claim 6, wherein the fastening feature is a clip.

8. A method of manufacturing the device of claim 1, comprising:
attaching the electrical package to the general circuit board; and
connecting the optical cable to the electrical package by mating the optical-electrical conversion device at one end of the optical cable to the electrical package,
wherein the optical-electrical conversion device is operable to convert an optical signal into an electrical signal or convert an electrical signal into an optical signal.

9. A device for converting signal, comprising;
an optical cable including an optical waveguide; and
an optical-electrical conversion device attached at one end of the optical cable, the optical-electrical conversion device for converting optical signal to electrical signal or for converting electrical signal to optical signal, said optical-electrical conversion device, including:
an active optical element,
an optical interface positioned between the optical waveguide and the active optical element, and which allows optical communication between the optical waveguide and the active optical element, and
at least one alignment structure for optically aligning the optical waveguide of the optical cable with the active optical element,
wherein the optical interface comprises an electrical contact to allow electrical communication between the active element and an electrical package, and
wherein the electrical package is to receive the optical-electrical conversion device in such a manner that the optical conversion device is removable from the electrical package.

10. The device of claim 9, wherein the optical cable comprises a plurality of optical fibers, and the active optical element includes a plurality of corresponding photodetectors, lasers, or combinations thereof.

11. The device of claim 9, wherein the optical interface comprises a lens positioned between an optical fiber of the optical waveguide and a photodetector or laser of the active optical element.

12. A method for converting optical signal to electrical signal and processing said electrical signal, comprising;
receiving an optical signal;
converting the optical signal to an electrical signal within an optical cable, said optical cable having an optical-electrical conversion device comprising an active optical element attached to an optical interface at one end, the optical-electrical conversion device operable to convert optical signal to electrical signal and to convert electrical signal to optical signal, the active optical element receiving the optical signal through at least one lens in the optical interface;
transferring the electrical signal from the optical cable to an electrical package through an electrical contact in the optical interface;
generating a processed signal at the electrical package; and
transferring the processed signal from the electrical package to a general circuit board attached to the electrical package,
wherein the optical-electrical conversion device is removable from the electrical package.

13. The method of claim 12, further comprising the preliminary step of removably attaching the optical cable to the electrical package.

14. The method of claim 12, further comprising converting electrical signal to optical signal for bi-directional communication.

15. The device of claim 1 comprising:
a standoff structure between the optical-conversion device and the optical cable to support the optical cable to the optical conversion device.

16. The device of claim 1 wherein the electrical package includes at least one post extending from the general circuit board, the at least one solder post to attach the electrical package to the general circuit board.

17. The device of claim 1
wherein the electrical package includes a recess to receive the active optical component.

18. The device of claim 1 wherein the electrical package includes at least one processor and wherein the optical-electrical conversion device is removable from the electrical package without removal of the at least one processor.

19. The device of claim 9 wherein the optical cable includes a fastening feature to attach the optical cable to the electrical package.

* * * * *